United States Patent
Juengling et al.

(10) Patent No.: US 7,115,512 B2
(45) Date of Patent: Oct. 3, 2006

(54) METHODS OF FORMING SEMICONDUCTOR CONSTRUCTIONS

(75) Inventors: Werner Juengling, Boise, ID (US); Steven M. McDonald, Meridian, ID (US); Kunal R. Parekh, Boise, ID (US)

(73) Assignee: Micron Technology, Boise, ID (US)

( * ) Notice: Subject to any disclaimer, the term of this patent is extended or adjusted under 35 U.S.C. 154(b) by 121 days.

(21) Appl. No.: 10/848,247

(22) Filed: May 17, 2004

(65) Prior Publication Data
US 2005/0255701 A1    Nov. 17, 2005

(51) Int. Cl.
*H01L 21/302* (2006.01)
(52) U.S. Cl. .................. 438/689; 438/6; 438/132; 438/601
(58) Field of Classification Search .............. 438/698, 438/6, 132, 601, 689
See application file for complete search history.

(56) References Cited

U.S. PATENT DOCUMENTS

| | | | | |
|---|---|---|---|---|
| 5,821,160 A | * | 10/1998 | Rodriguez et al. | 438/601 |
| 6,180,503 B1 | * | 1/2001 | Tzeng et al. | 438/601 |
| 2001/0030169 A1 | * | 10/2001 | Kitagawa et al. | 216/17 |
| 2004/0140501 A1 | * | 7/2004 | Kim | 257/328 |
| 2004/0245598 A1 | * | 12/2004 | Yamaguchi | 257/529 |

* cited by examiner

*Primary Examiner*—Nadine Norton
*Assistant Examiner*—Mahmoud Dahimene
(74) *Attorney, Agent, or Firm*—Wells St. John P.S.

(57) ABSTRACT

The invention includes methods by which a fuse box of a semiconductor construction is fabricated to have a substantially uniform layer over fuses extending therein. In particular aspects, the invention includes methods in which one or more processing steps associated with fabrication and patterning of bond pads and redistribution layers is conducted simultaneously over a fuse box region to form and/or remove materials that are directly over the fuse box region.

32 Claims, 5 Drawing Sheets

METHODS OF FORMING SEMICONDUCTOR CONSTRUCTIONS

TECHNICAL FIELD

The invention pertains to methods of forming semiconductor constructions, and in particular aspects pertains to methods associated with formation of fuse access regions, bond pads and redistribution layers.

BACKGROUND OF THE INVENTION

Two facets of prior art semiconductor constructions are pertinent to exemplary aspects of the present invention. One is the utilization of bond pads and redistribution layers, and the other is the utilization of fuses. Both facets are described with reference to a prior art semiconductor construction 10 shown in FIGS. 1 and 2.

Construction 10 comprises a semiconductor substrate 12 having a surface 14 of insulative material. The substrate 12 also comprises a first series of bond pads 16 extending vertically along a central region of the top view of FIG. 1. The bond pads 16 are beneath surface 14 in the top view, and accordingly are shown in dashed-line view in FIG. 1. Semiconductor substrate 12 comprises a package having a semiconductor die (such as, for example, a silicon wafer die) (not shown) and integrated circuitry associated therewith (not shown) covered by insulative material 14. Bond pads 16 electrically interconnect with such integrated circuitry, and are utilized for providing electrical connection between the integrated circuitry contained within the package of construction 10 and other circuitry (not shown) external of construction 10. For instance, construction 10 can comprise a memory chip and bond pads 16 can be utilized for electrically connecting the memory chip with other circuitry, including, for example, circuitry leading to a computer processor.

Bond pads 16 are frequently too tightly packed to readily enable direct connection between bond pads 16 and other circuitry external of the pads. Accordingly, another set of pads 18 is formed, and redistribution layers 20 are provided to electrically connect pads 18 with pads 16. Pads 18 would typically not be covered by insulative material 14, so that the pads 18 are exposed for electrical connection to circuitry external of construction 10. In contrast, redistribution layers 20 typically are covered by insulative material 14 to protect such redistribution layers, and accordingly the redistribution layers are shown in dashed-line view in FIG. 1. Bond pads 18 are significantly more disperse from one another than are bond pads 16.

As discussed previously, the bond pads 16 and 18 are utilized for electrically connecting to circuitry associated with substrate 12, and accordingly for providing electrical access to such circuitry. Pads 16 and 18 are thus exemplary access nodes.

Figure 1:
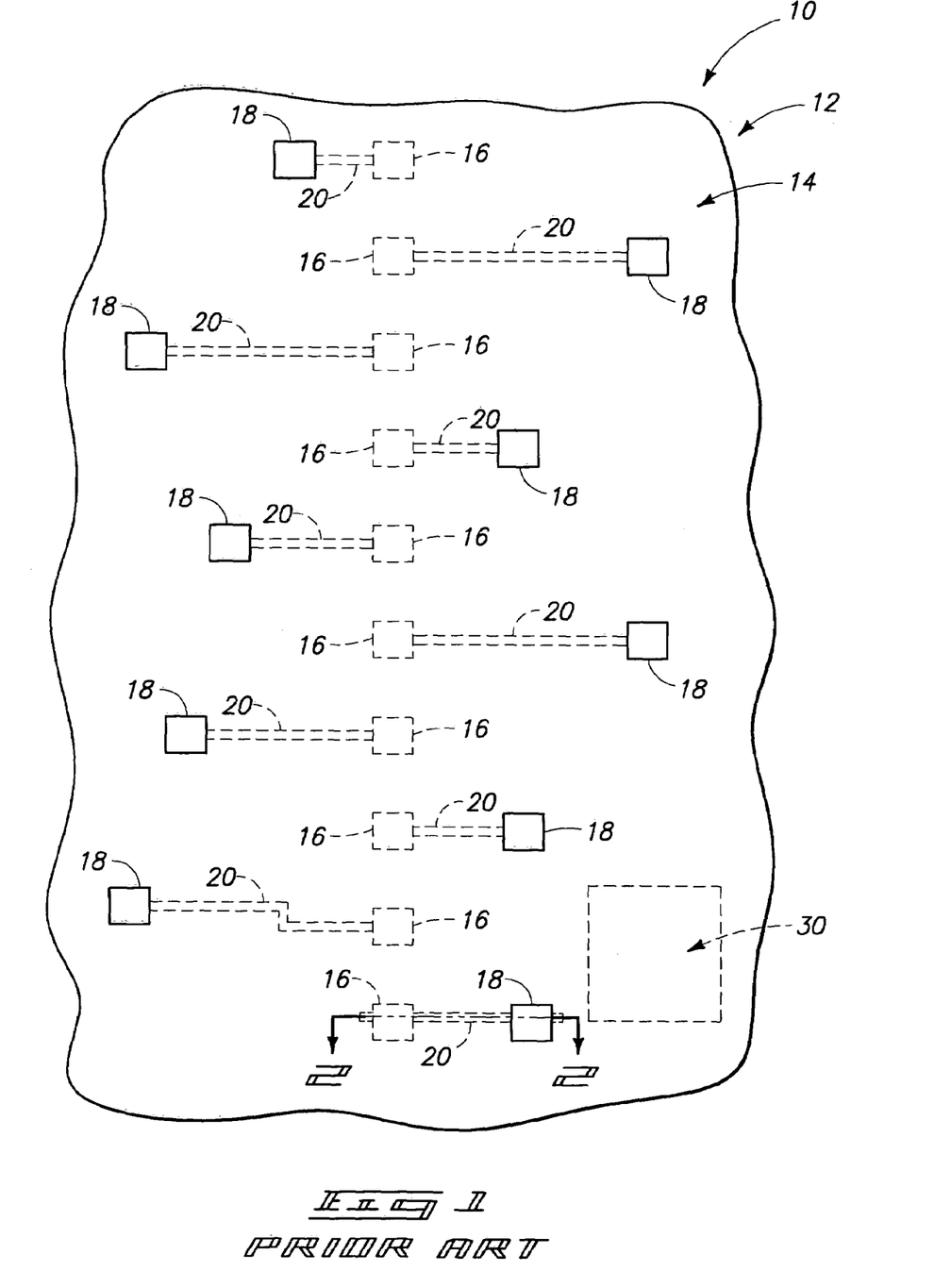
FIG. 1 is a Diagrammatic top view of a fragment of a prior art semiconductor construction.
Figure 2:
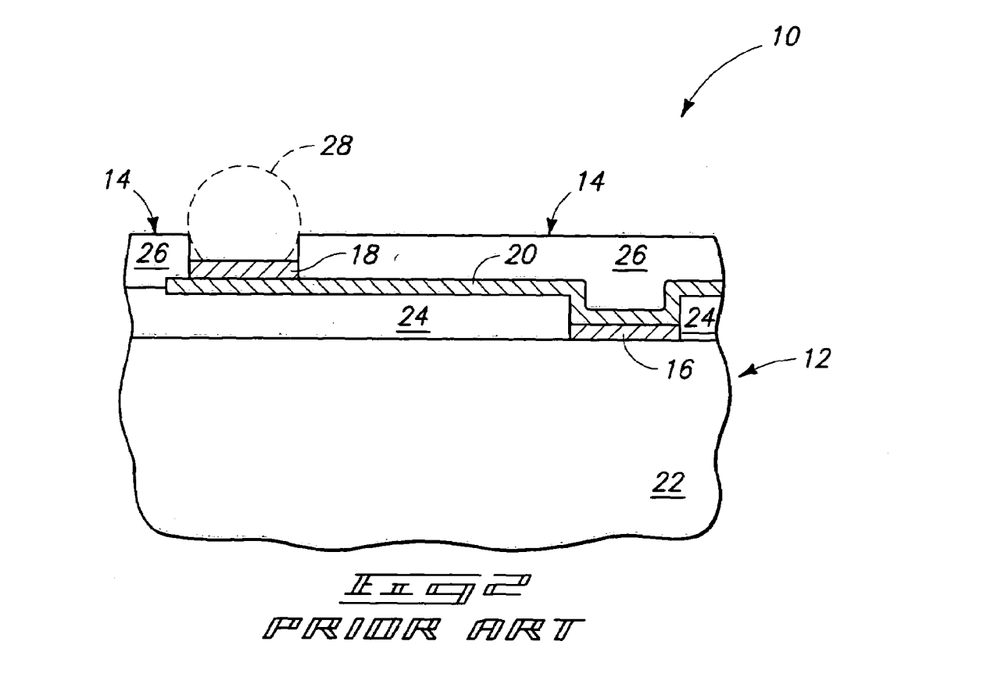
FIG. 2 is a cross-sectional side view along the line 2—2 of FIG. 1.

FIG. 2 shows a cross-sectional view along the line 2—2 of FIG. 1, and illustrates an exemplary assembly of bond pads 16 and 18, and redistribution layer 20. The assembly includes a base 22 which can comprise numerous layers of insulative and conductive material. In particular aspects, base 22 will comprise the semiconductor die and integrated circuitry referred to above. For purposes of interpreting this disclosure and the claims that follow, it is useful to define the terms "semiconductor substrate" and "substrate". Accordingly, the terms "semiconductive substrate" and "semiconductor substrate" are to be understood in this document to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" is to be understood to refer to any supporting structure, including, but not limited to, the semiconductive substrates described above. Accordingly, base 22 can be considered a semiconductor substrate if the base comprises a semiconductor die. Also, base 22 in combination with one or more of the layers thereover can be considered a semiconductor substrate if the base comprises a semiconductor die.

An insulative material 24 is over base 22, and pads 16 are within openings extending through insulative material 24. Insulative material 24 can comprise any suitable material, including, for example, silicon dioxide, silicon nitride, borophosphosilicate glass (BPSG), etc. Additionally, pad 16 can comprise any suitable conductive material or combination of conductive materials, and in particular aspects will comprise, consist essentially of, or consist of one or more metals, metal alloys, or metal-containing compounds. For instance, pad 16 can comprise, consist essentially of, or consist of one or more of copper, silver, aluminum, gold and nickel. Although pad 16 is shown comprising a single homogeneous layer, it is to be understood that pad 16 can comprise multiple layers.

Redistribution layer 20 is formed over insulative material 24 and in electrical connection with pad 16. Redistribution layer 20 can comprise any suitable conductive material or combination of conductive materials, and in particular aspects will comprise, consist essentially of, or consist of one or more of metals, metal compounds, metal alloys, and/or conductively-doped semiconductor material (such as conductively-doped silicon).

An insulative material 26 is formed over redistribution layer 20 and over insulative material 24. Insulative material 26 can be any suitable material, including, for example, BPSG, phosphosilicate glass (PSG), polyimide, etc. Insulative material 26 comprises the upper surface 14 shown in FIG. 1.

Bond pads 18 are formed within openings in insulative material 14, and in electrical connection with redistribution layer 20. Bond pads 18 can comprise any suitable electrically conductive material or combination of materials. In particular aspects, bond pads 18 will comprise a nickel-containing layer adjacent redistribution layer 20, and a gold-containing layer over the nickel-containing layer.

As discussed previously with reference to FIG. 1, bond pads 18 are ultimately utilized for forming electrical connections to circuitry external of construction 10. Such connections will typically be achieved through utilization of solder balls, and specifically a ball grid array will be formed over the pads 18 of the FIG. 1 construction. An exemplary solder ball 28 is diagrammatically illustrated in FIG. 2 as being electrically connected with shown bond pad 18. Solder ball 28 is shown in dashed-line view in FIG. 2 to indicate that the solder ball structure is only shown in FIG. 2, and not in FIG. 1.

FIG. 1 shows a region 30 demarcated by a dashed-line square. Such region is a diagrammatic illustration of a fuse box region (or alternatively a fuse access region). The region 30 is shown as a square and referred to as a fuse "box," but it is to be understood that fuse box region 30 can have any suitable peripheral shape, including, for example, curved shapes, polygonal shapes, etc. Fuses are provided to extend within region 30 of construction 10 so that various circuit elements within the construction can be electrically decoupled from other elements. Numerous uses of fuses are known to persons of ordinary skill in the art. For instance, the fuses can be utilized for disconnecting circuit elements which are utilized only for testing of circuitry components associated with construction 10, for disconnecting circuit elements which are found to be faulty through testing of the circuitry so that redundant circuitry can be utilized in place of the faulty circuitry, etc.

The fuse box location 30 will typically comprise a number of fuses beneath surface 14. The fuses can be configured to be broken (i.e. "blown") with appropriate energy input, such as, for example, laser-energy input and/or thermal-energy input. It is desired that the material over the fuses be uniformly thick across the fuses so that the energy utilized to penetrate through the material and break the fuses is uniform across the fuses in the fuse box region. Numerous difficulties are encountered, however, in attempting to form a uniform-thickness material across all of the fuses contained within fuse box region 30. Accordingly, some aspects of the invention described herein pertain to methodologies which can enable a substantially uniform thickness of material to be provided over the fuses within a fuse box region. However, although the invention was motivated from this perspective, the invention is not so limited. Rather, the invention is only limited by the accompanying claims as literally worded, and in accordance with the doctrine of equivalents.

SUMMARY OF THE INVENTION

In one aspect, the invention pertains to a method of forming a semiconductor construction. A semiconductor substrate is provided to have a fuse access region and a plurality of fuses extending into the fuse access region. The substrate further comprises an insulative material directly over the fuse access region. The substrate also comprises an access node. Additionally, the substrate includes a sacrificial material directly over the fuse access region, and includes a conductive material layer in physical contact with both the access node and the sacrificial material. The method includes patterning the conductive material layer and simultaneously removing at least some of the sacrificial material from directly over the fuse access region to expose the insulative material.

In one aspect, the invention includes a method in which a semiconductor substrate is provided to have a fuse access region and a bond pad location, to have a plurality of fuses extending into the fuse access region, and further to have an insulative material cap directly over the fuse access region. A bond pad is formed over the bond pad location and a conductive material cap is formed directly over the insulative material cap simultaneously with the formation of at least some of the bond pad.

In one aspect, the invention includes a method in which a semiconductor substrate is provided to have a fuse box region, to have one or more fuses at least partially within the fuse box region, and to have a fuse box cap over the one or more fuses within the fuse box region. At least one access node is formed over the substrate, with the access node comprising one or more electrically conductive access node materials. A sacrificial cover material is formed over the fuse box cap from at least one of the electrically conductive access node materials. A patterned material is formed over the substrate. The patterned material has one or more first openings extending therethrough to one or more of the access nodes, and has a second opening extending therethrough to the sacrificial cover material. A redistribution layer is formed over the patterned material and within the first and second openings. The redistribution layer is patterned into one or more redistribution lines, with such patterning comprising exposure of the redistribution layer to etching conditions. At least some of the sacrificial cover material is removed during the patterning of the redistribution layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes methods in which materials associated with bond pads and redistribution layers are formed over and/or removed from over a fuse box region simultaneously with the formation of bond pads and redistribution layers. Methodology of the present invention can enable a uniform thickness of material to be formed across all of the fuses extending within a fuse box. An exemplary aspect of the invention is described with reference to FIGS. 3–8.

Figure 3:
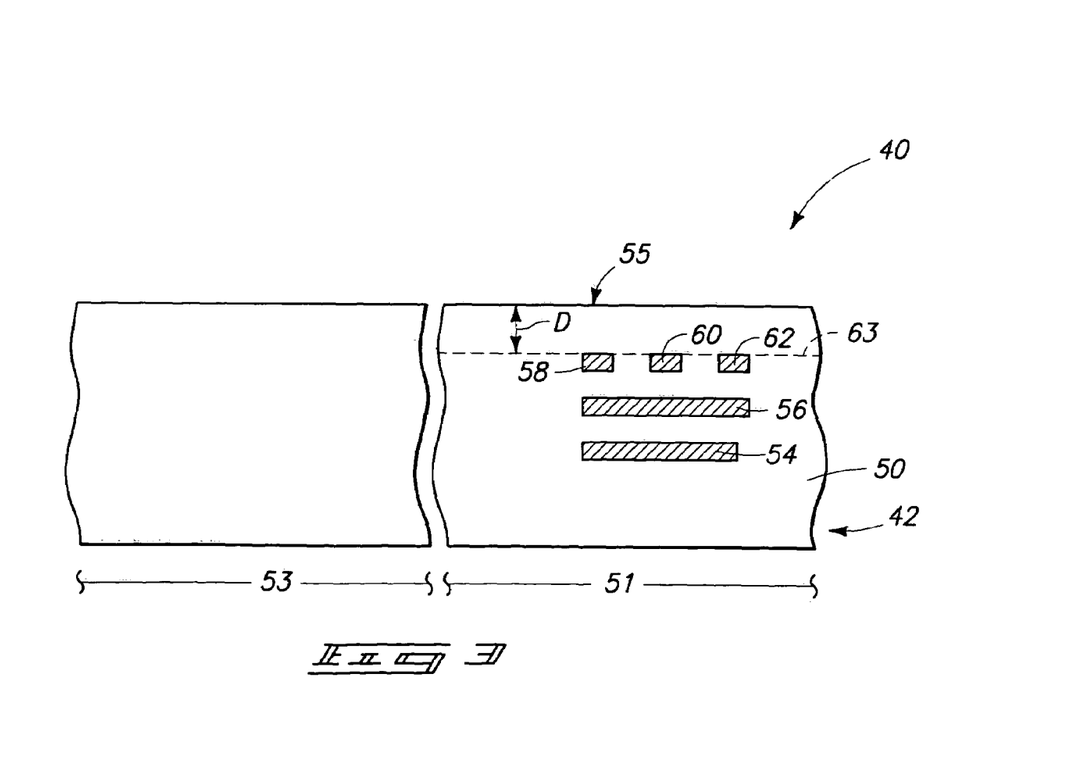
FIG. 3 is a diagrammatic, fragmentary, cross-sectional side view of a semiconductor construction at a preliminary processing stage in accordance with an exemplary aspect of the present invention.

Referring initially to FIG. 3, a semiconductor construction 40 comprises a substrate 42 having a plurality of conductive structures 54, 56, 58, 60 and 62 therein. Conductive structures 54 and 56 correspond to conductive lines which can extend longitudinally within the cross-sectional view of FIG. 3, and/or can extend into and out of the page relative to the cross-sectional view of FIG. 3. Conductive structures 54 and 56 can comprise any suitable electrically conductive compositions, including, for example, various metals, metal alloys, metal compounds, and/or conductively-doped silicon. Conductive structures can be utilized for electrical connection to integrated circuitry, and/or can be utilized for limiting propagation of fuse blow damage (the blowing of a fuse is discussed in more detail below with reference to FIG. 8). In some aspects, reflective materials can be utilized in place of, in addition to, or as at least a portion of the conductive lines to limit propagation of fuse blow damage.

Conductive structures 58, 60 and 62 correspond to fuses extending into and out of the page relative to the view of FIG. 3. Fuses 58, 60 and 62 can comprise any suitable materials, including, for example, materials which can be broken with laser-emitted energy, and/or materials which can be broken with thermal energy. Suitable materials for the fuses include, for example, compositions comprising, consisting essentially of, or consisting of one or both of aluminum and copper.

Although three fuses are shown, it is to be understood that there can be more fuses or less fuses. Also, although only two conductive layers are shown underneath the fuses, it is to be understood that there can be more than two levels of conductive materials under the fuses, or less than two levels of conductive materials under the fuses. Construction 40 is divided amongst a fuse box region 51 and a bond pad region 53, and fuses 58, 60 and 62 are shown within the fuse box region 51.

The substrate 42 can be a semiconductor substrate. Accordingly, substrate 42 can comprise a semiconductive material wafer (not shown), which would typically be at a level below the shown conductive structures 54, 56, 58, 60 and 62. Substrate 42 comprises insulative material 50 (for example, BPSG, PSG, silicon dioxide, etc.), extending around the conductive materials and electrically insulating the conductive materials from one another. Although material 50 is shown to be a homogeneous material around the conductive materials 54, 56, 58, 60 and 62, it is to be understood that material 50 can comprise numerous layers of different insulative materials.

In particular aspects of the invention, fuses 58, 60 and 62 are configured to be broken with laser-emitted energy. Accordingly, the portion of material 50 over fuses 58, 60 and 62 will be a material through which the laser-emitted energy can pass. The insulative material over fuses 58, 60 and 62 can be referred to as an insulative material cap, and is demarcated in FIG. 3 by dashed line 63. The insulative material cap can be of the same composition as the insulative material below the cap, or of a different composition. Accordingly, line 63 can correspond to an interface between different insulative material compositions in some aspects of the invention, and in other aspects can correspond to a defined location within a homogeneous insulative composition.

In a particular aspect of the invention, the insulative material cap can comprise, consist essentially of or consist of silicon dioxide having a thickness of about 3000 Å or less over fuses 58, 60 and 62. The thickness of the insulative material cap over fuses 58, 60 and 62 is illustrated in FIG. 3 by the distance "D". It is noted that such distance is uniform across all of the fuses 58, 60 and 62. Such can be accomplished by flowing insulative material over fuses 58, 60 and 62 and subsequently planarizing the material with, for example, chemical-mechanical polishing to form the material to be of uniform thickness over the fuses. In the shown aspect of the invention, insulative material has a planarized upper surface 55 extending across regions 51 and 53.

As discussed previously, the term "substrate" as utilized herein can include various materials or combinations of materials. Accordingly, in some aspects of the invention, the substrate can be considered to comprise a fuse bank having the insulative material 50 extending thereover to a uniform thickness across a plurality of fuses within the fuse bank. The term "fuse bank" is used to refer to a portion of a semiconductor substrate which contains a plurality of fuses extending therein. The region of the substrate where the fuses are ultimately to be accessed to break (in other words, blow) the fuses can be referred to as a fuse access region.

The fuses 58, 60 and 62 can be considered to extend within the fuse access region, and the insulative material 50 over the fuses can be considered to be directly over the fuse access region. In other words, the location of portions of the fuses which are configured to be accessible for breakage can be considered to define a fuse access region, and any materials over such portions of the fuses can be considered to be over the fuse access region. For instance, if the fuses are configured to be broken with laser-emitted light, the fuse access region can be a region of the fuses which is under a cap transparent enough to the laser-emitted light that the light can pass through the cap to break selected fuses. The term "directly over" is utilized to refer to an orientation in which two materials are at different elevational orientations relative to one another and overlap a common vertical axis, as opposed to the term "over" which simply means that one material is elevationally above another. In the context of this document, the term "directly over" only means that layers at different orientations have lateral overlap with one another, and does not imply physical contact between the layers.

Figure 4:
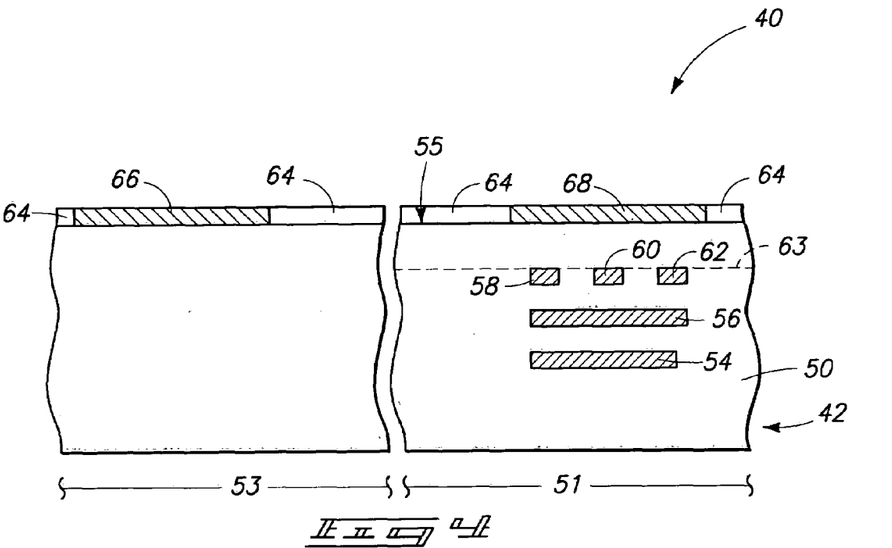
FIG. 4 is a view of the FIG. 3 fragment shown at a processing stage subsequent to that of FIG. 3.

Referring next to FIG. 4, a patterned insulative material 64 is formed over surface 55, and an access node 66 is formed within material 64. Material 64 can comprise any suitable electrically insulative material or combination of materials, including, for example, silicon dioxide, silicon nitride, polyimide, etc, and can correspond to a passivation layer in some aspects of the invention. Material 64 can be patterned by forming the material to cover an entirety of surface 55, forming a photolithographically patterned layer of photoresist thereover, transferring a pattern from the photoresist to layer 64, and subsequently removing the photoresist.

Access node 66 can comprise any suitable electrically conductive material or combination of materials including, for example, one or more of aluminum, copper, silver, nickel, gold, etc. Node 66 can correspond one of the bond pads 16 described above with reference to FIGS. 1 and 2, and can be formed in electrical connection with conductive integrated circuit structures (not shown) within substrate 42.

A conductive structure 68 is formed over the fuse access region simultaneously with the formation of node 66. Conductive structure 68 can comprise the identical conductive materials as are utilized within node 66, and accordingly can comprise, for example, one or more of aluminum, copper, silver, nickel, gold, etc. Structure 68 can be referred to as a sacrificial material formed over the fuse access region since at least some of material 68 is removed from over the fuse access region in exemplary aspects of the invention (as described below). Additionally, or alternatively, structure 68 can be referred to as a conductive material cap formed directly over the fuse access region.

Figure 5:
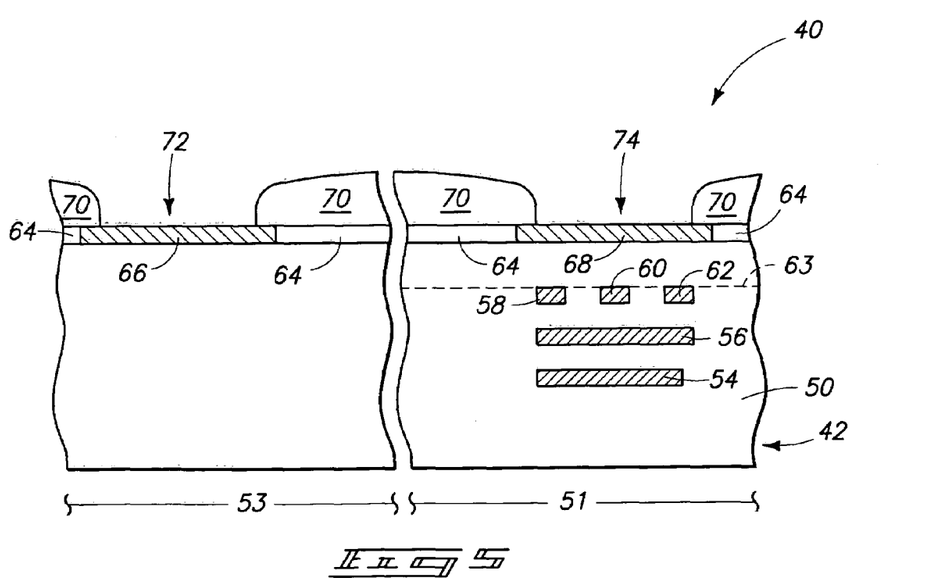
FIG. 5 is a view of the FIG. 3 fragment shown at a processing stage subsequent to that of FIG. 4.

Referring next to FIG. 5, a patterned electrically insulative material 70 is formed over material 64. Patterned material 70 has openings 72 and 74 extending therethrough to access node 66 and structure 68, respectively. Insulative material 70 can comprise any suitable material, including, for example, one or more of silicon dioxide, silicon nitride, polyimide, etc. Patterned material 70 can be formed by providing the material 70 across an entire upper surface of construction 40, subsequently forming photolithographically patterned photoresist over material 70, transferring a pattern from the photoresist to material 70, and then removing the photoresist to leave the shown patterned material 70. Materials 70 and 64 can together correspond to the material 24 described above with reference to FIG. 2.

Figure 6:
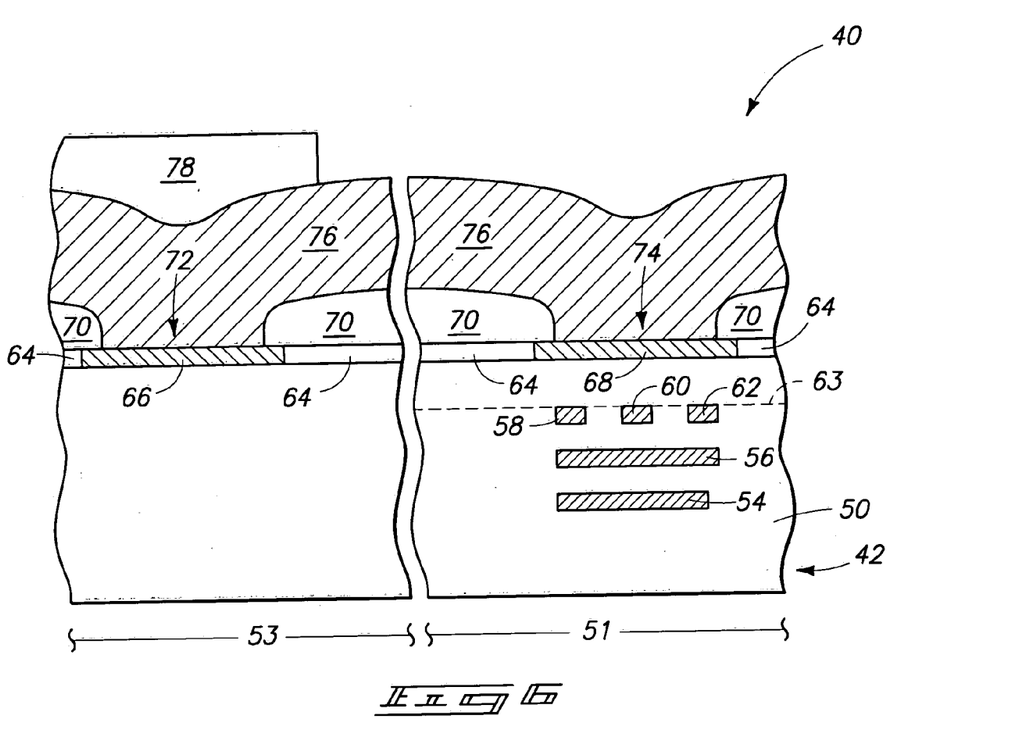
FIG. 6 is a view of the FIG. 3 fragment shown at a processing stage subsequent to that of FIG. 5.

Referring next to FIG. 6, a conductive layer 76 is formed over insulative material 70 and within openings 72 and 74 to electrically connect with access node 66 and conductive structure 68. Layer 76 can comprise any suitable electrically conductive material or combination of materials, including, for example, metals, metal compounds, and/or conductively-doped silicon. In particular aspects, layer 76 will comprise, consist essentially of, or consist of one or both of copper and aluminum. Layer 76 can correspond to the redistribution layer 20 discussed above with reference to FIGS. 1 and 2.

A patterned masking material 78 is formed over layer 76. Masking material 78 can correspond to, for example, photoresist patterned utilizing photolithographic processing.

Figure 7:
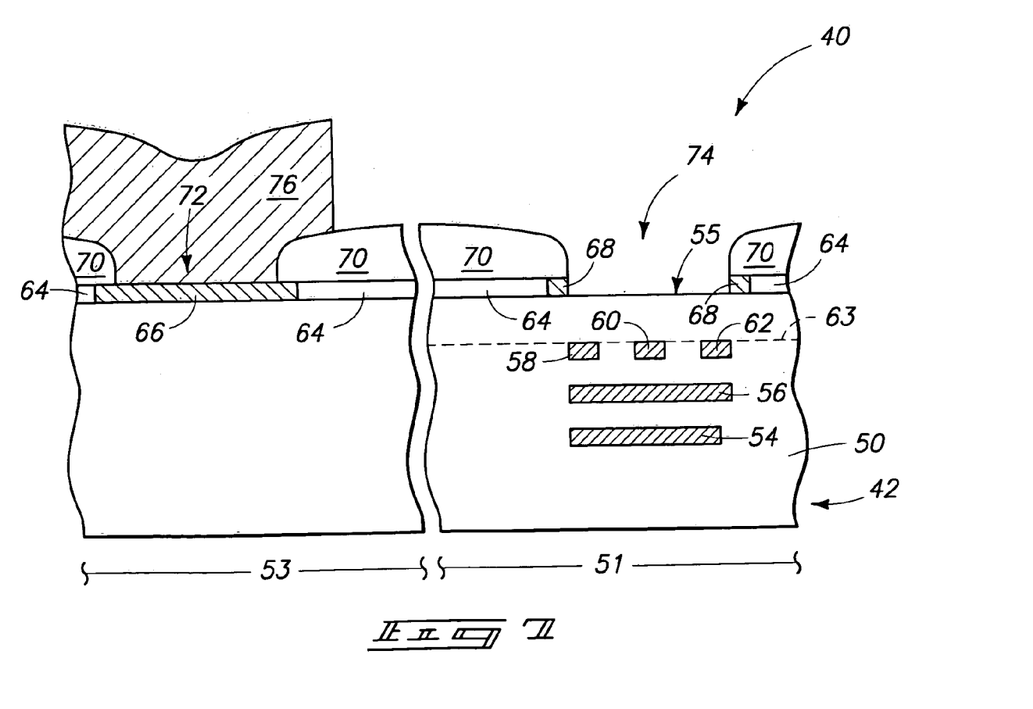
FIG. 7 is a view of the FIG. 3 fragment shown at a processing stage subsequent to that of FIG. 6.

Referring next to FIG. 7, a pattern is transferred from patterned masking material 78 (FIG. 6) to conductive layer 76, and subsequently masking material 78 is removed. The patterned material 76 can be in the form of one of the redistribution lines 20 discussed previously with reference to FIG. 1. The patterning of layer 76 comprises subjecting layer 76 to a suitable etch. Such etch can include, for example, a wet etch utilizing phosphoric acid or a dry etch.

Conductive structure 68 is exposed to the conditions utilized to etch layer 76 and is at least partially removed by such etching conditions. Accordingly, at least some of sacrificial material of structure 68 is removed simultaneously with the patterning of conductive layer 76. In the shown aspect of the invention, only some of conductive structure 68 is removed, while other portions of conductive structure 68 are covered by insulative material 70 and protected from the etching conditions by such insulative material. It is to be understood that the invention encompasses other aspects (not shown) in which all of sacrificial material 68 is removed. Such can occur by utilization of an etch which undercuts protective material 70 or by patterning of material 70 so that none of material 68 is covered by the material 70.

The removal of some of sacrificial material 68 from over the fuse access region exposes surface 55 directly over the fuse access region. As discussed previously, surface 55 is preferably a uniform distance over all of the fuses within the fuse access region (the shown fuses 58, 60 and 62), and accordingly a substantially uniform thickness of insulative material is over fuses 58, 60 and 62 within the fuse access region at the processing stage of FIG. 7. The insulative material over fuses 58, 60 and 62 is referred to as being a "substantially uniform thickness" over the fuses to indicate that there may be some minor variations in thickness within the material due to limitations in the processing utilized to form planarized surface 55 and/or limitations in other processing utilized to form the structure of FIG. 7. Regardless, the insulative material over fuses 58, 60 and 62 will typically be of uniform thickness within tolerances of the processing procedures utilized to form the structure of FIG. 7.

In subsequent processing, material 76 can be connected to a bond pad 18 of the type described with reference to FIG. 2, and a solder ball can be formed over the redistribution layer.

Figure 8:
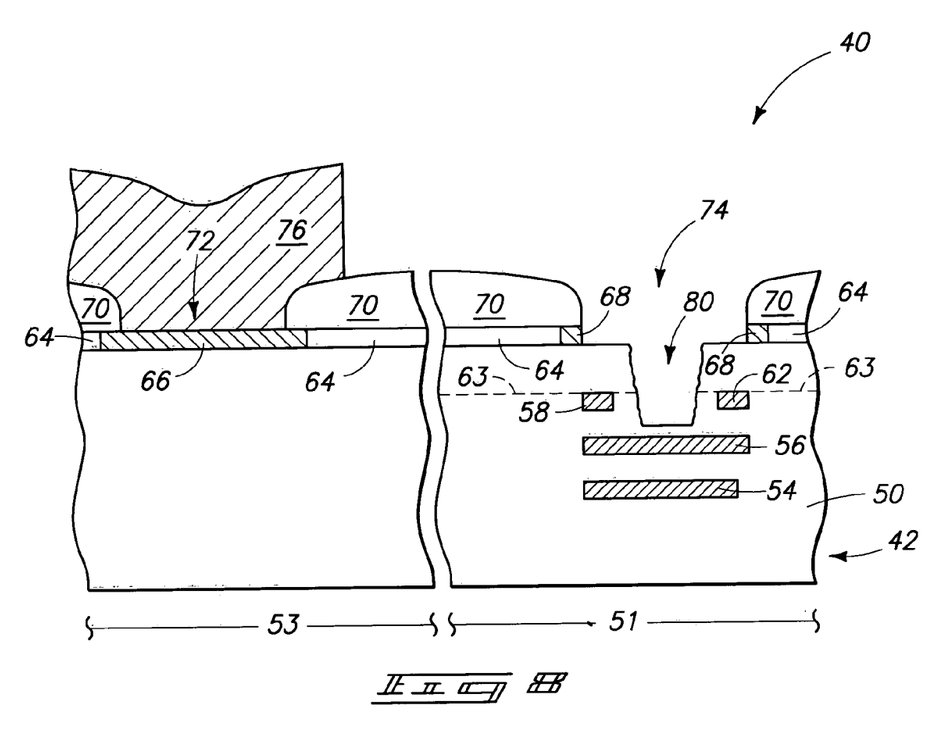
FIG. 8 is a view of the FIG. 7 fragment shown at an optional stage in which a fuse of the FIG. 7 fragment has been subjected to appropriate energy to break the fuse.

Referring next to FIG. 8, one or more of the fuses within the fuse access region can be subjected to appropriate energy to break them. For instance, the fuses can be configured to be broken by either laser-light energy or thermal energy, and the appropriate energy can be directed through the insulative material cap over the fuses to break one or more of the fuses. In an exemplary aspect, laser-light energy is directed to the insulative material cap to break one or more of the fuses, and is shown breaking the fuse 60 (FIG. 7) to leave a disrupted region 80 where the fuse 60 had previously been. Such disrupted region can decouple electrical devices previously connected by fuse 60. The decoupling of the electrical devices can be desired for numerous reasons that will be readily recognized by persons of ordinary skill in the art.

The methodology of the present invention has several advantages. The fuse access region does not have excess materials thereover (either conductive, for example, metal-containing materials; or insulative, for example, passivation materials) which could inhibit fuse blow. The conductive and/or reflective materials below the fuses can inhibit propagation of fuse blow damage. The thickness of material directly over the fuses in the fuse access region is substantially uniform across all of the fuses and the uniformity of the thickness is not adversely affected by the etches utilized to pattern bond pads and redistribution layers. The methodology of the invention can allow tight control of the thickness of material (such as, for example, silicon dioxide) over fuses within a fuse access region.

In prior art methodologies, a fuse access region would be subjected to a specific etch (and in some cases a refill) to attempt to form a known thickness of insulative material over the fuses. The etch would be separate from etches utilized for patterning bond pads and redistribution layers, and hence would require a separate mask. Methodology of the present invention eliminates a mask compared to such prior art methods, and can allow tighter control of the thickness of insulative material over the fuses than could be achieved with such prior art methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
    providing a semiconductor substrate having a fuse access region and a bond pad location, having a plurality of fuses extending into the fuse access region, and having an insulative material cap directly over the fuse access region;
    forming a bond pad over the bond pad location;
    forming a conductive material cap over the insulative material cap and directly over the fuse access region simultaneously with the formation of at least some of the bond pad;
    removing at least some of the conductive material cap from over the insulative material cap;
    prior to removing said at least some of the conductive material cap from over the insulative material cap, forming a redistribution layer in electrical connection with the bond pad and the conductive material cap; and
    patterning the redistribution layer simultaneously with the removing of said at least some of the conductive material cap.

2. The method of claim 1 wherein the bond pad and conductive material cap are the same composition as one another.

3. The method of claim 2 wherein the bond pad and conductive material cap both comprise metal, metal alloy and/or metal compound.

4. The method of claim 2 wherein the bond pad and conductive material cap both comprise one or more of copper, aluminum, nickel, gold and silver.

5. The method of claim 2 wherein the bond pad and conductive material cap both consist essentially of one or more of copper, aluminum, nickel, gold and silver.

6. The method of claim 2 wherein the bond pad and conductive material cap both consist of one or more of copper, aluminum, nickel, gold and silver.

7. A method of forming a semiconductor construction, comprising:
provuding a semiconductor substrate having a fuse box region, having one or more fuses that are at least partially within the fuse box region, and having a fuse box cap over the one or more fuses within the fuse box region;
forming at least one access node over the substrate, the access node comprising one or more electrically conductive access node materials;
forming a sacrificial cover material over the fuse box cap from at least one of the electrically conductive access node materials;
forming a patterned material over the substrate, the patterned material having one or more first openings extending therethrough to one or more of said at least one access nodes and having a second opening extending therethrough to the sacrificial cover material;
forming a redistribution layer over the patterned material and within the first and second openings;
patterning the redistribution layer into one more redistribution lines, the patterning comprising exposure of the redistribution layer to etching conditions; and
during the etching conditions utilized for patterning the redistribution layer, removing at least some of the sacrificial cover material.

8. The method of claim 7 wherein a patterned photoresist mask is over the redistribution layer during the patterning of the redistribution layer and during the removal of said at least some of the sacrificial cover material.

9. The method of claim 7 wherein a plurality of the fuses are at least partially within the fuse box region, and wherein the fuse box cap has a substantially uniform thickness over all of the fuses within the fuse box region.

10. The method of claim 9 wherein the substantially uniform thickness is about 3000 Å.

11. The method of claim 7 wherein the fuses are configured to be broken by thermal energy.

12. The method of claim 7 wherein the fuses are configured to be broken by laser-light energy.

13. The method of claim 9 further comprising, after removing said at least some of the sacrificial cover material, exposing one or more of the fuses to laser-light energy directed through the cap to the fuse box to break said one or more of the fuses.

14. The method of claim 13 wherein the semiconductor substrate further comprises one or more conductive materials beneath the fuses in the fuse box region, wherein the breaking of the one or more fuses forms a disrupted region extending into the semiconductor substrate, and wherein said one or more conductive materials limit propagation of the disrupted region formed during the breaking of said one or more fuses.

15. The method of claim 13 wherein the semiconductor substrate further comprises one or more reflective materials beneath the fuses in the fuse box region, wherein the breaking of the one or more fuses forms a disrupted region extending into the semiconductor substrate, and wherein said one or more reflective materials limit propagation of the disrupted region formed during the breaking of said one or more fuses.

16. The method of claim 7 wherein only some of the sacrificial cover material is removed by exposure to said etching conditions.

17. The method of claim 7 wherein all of the sacrificial cover material is removed by exposure to said etching conditions.

18. The method of claim 7 wherein said at least one access node and the sacrificial cover material both comprises one or more of copper, aluminum, silver, nickel and gold.

19. A method of forming a semiconductor construct on, comprising:
providing a semiconductor substrate having a fuse access region, having a plurality of fuses extending into the fuse access region, and having an insulative material cap directly over the fuse access region;
forming at least one electrically conductive access node over the substrate and simultaneously forming an electrically conductive structure over the insulative material cap;
forming a redistribution layer in physical contact with the access node and with the electrically conductive structure; and
patterning the redistribution layer into one more redistribution lines and simultaneously removing at least some of the electrically conductive structure from over the insulative material cap.

20. The method of claim 19 wherein the insulative material cap has a substantially uniform thickness over all of the fuses within the fuse box region.

21. The method of claim 20 wherein the substantially uniform thickness is about 3000 Å.

22. The method of claim 19 wherein only some of the electrically conductive structure is removed by exposure to said etching conditions.

23. The method of claim 19 wherein all of the electrically conductive structure is removed by exposure to said etching conditions.

24. The method of claim 19 wherein said at least one access node and said electrically conductive structure both comprise one or more of copper, aluminum, silver, nickel and gold.

25. The method of claim 19 wherein the fuses are configured to be broken by thermal energy.

26. The method of claim 25 further comprising, after removing said at least some of the electrically conductive structure, exposing one or more of the fuses to thermal energy directed through the insulative material cap to the fuse access region to break said one or more of the fuses.

27. The method of claim 26 wherein the semiconductor substrate further comprises one or more conductive materials beneath the fuses in the fuse access region, wherein the breaking of the one or more fuses forms a disrupted region extending into the semiconductor substrate, and wherein said one or more conductive materials limit propagation of the disrupted region formed during the breaking of said one or more fuses.

28. The method of claim 26 wherein the semiconductor substrate further comprises one or more reflective materials beneath the fuses in the fuse access region, wherein the breaking of the one or more fuses forms a disrupted region extending into the semiconductor substrate, and wherein said one or more reflective materials limit propagation of the disrupted region formed during the breaking of said one or more fuses.

29. The method of claim 19 wherein the fuses are configured to be broken by laser-light energy.

30. The method of claim 29 further comprising, after removing said at least some of the electrically conductive structure, exposing one or more of the fuses to laser-light energy directed through the insulative material cap to the fuse access region to break said one or more of the fuses.

31. The method of claim 30 wherein the semiconductor substrate further comprises one or more conductive materials beneath the fuses in the fuse access region, wherein the breaking of the one or more fuses forms a disrupted region extending into the semiconductor substrate, and wherein said one or more conductive materials limit propagation of the disrupted region formed during the breaking of said one or more fuses.

32. The method of claim 30 wherein the semiconductor substrate further comprises one or more reflective materials beneath the fuses in the fuse access region, wherein the breaking of the one or more fuses forms a disrupted region extending into the semiconductor substrate, and wherein said one or more reflective materials limit propagation of the disrupted region formed during the breaking of said one or more fuses.

* * * * *

UNITED STATES PATENT AND TRADEMARK OFFICE
CERTIFICATE OF CORRECTION

| | |
|---|---|
| PATENT NO. | : 7,115,512 B2 |
| APPLICATION NO. | : 10/848247 |
| DATED | : October 3, 2006 |
| INVENTOR(S) | : Werner Juengling |

It is certified that error appears in the above-identified patent and that said Letters Patent is hereby corrected as shown below:

Title page, (73) Assignee –
  Replace "Micron Technology, Boise, ID (US)"
  With -- Micron Technology, Inc., Boise, ID (US)--

Col. 4, line 14 –
  Replace "FIG. 1 is a Diagrammatic top view of a fragment of a prior"
  With -- FIG. 1 is a diagrammatic top view of a fragment of a prior --

Col. 6, line 36 –
  Replace "nickel, gold, etc. Node 66 can correspond one of the bond"
  With -- nickel, gold, etc. Node 66 can correspond to one of the bond --

Col. 9, line 27 –
  Replace "patterning the redistribution layer into one more"
  With --patterning the redistribution layer into one or more--

Col. 10, line 8 –
  Replace "node and the sacrificial cover material both comprises one or"
  With -- node and the sacrificial cover material both comprise one or--

Col. 10, line 10 –
  Replace "19. A method of forming a semiconductor construct on"
  With --19. A method of forming a semiconductor construction--

UNITED STATES PATENT AND TRADEMARK OFFICE
CERTIFICATE OF CORRECTION

PATENT NO.         : 7,115,512 B2
APPLICATION NO.    : 10/848247
DATED              : October 3, 2006
INVENTOR(S)        : Werner Juengling It is certified that error appears in the above-identified patent and that said Letters Patent is hereby corrected as shown below:

Col. 10, line 24 –
  Replace "patterning the redistribution layer into one more"
  With --patterning the redistribution layer into one or more--

Signed and Sealed this

Nineteenth Day of June, 2007

JON W. DUDAS
*Director of the United States Patent and Trademark Office*